(12) United States Patent
Hung et al.

(10) Patent No.: US 8,264,056 B2
(45) Date of Patent: Sep. 11, 2012

(54) SCHOTTKY DIODE

(75) Inventors: Chung Yu Hung, Changhua County (TW); Chih Min Hu, Kaohsiung (TW); Wing Chor Chan, Hsinchu (TW); Jeng Gong, Taichung (TW)

(73) Assignee: Macronix International Co., Ltd. (TW)

( * ) Notice: Subject to any disclaimer, the term of this patent is extended or adjusted under 35 U.S.C. 154(b) by 271 days.

(21) Appl. No.: 12/845,925

(22) Filed: Jul. 29, 2010

(65) Prior Publication Data

US 2012/0025278 A1   Feb. 2, 2012

(51) Int. Cl.
*H01L 27/095* (2006.01)
*H01L 29/47* (2006.01)
*H01L 29/812* (2006.01)
(52) U.S. Cl. .. 257/476; 257/483; 257/486; 257/E29.013
(58) Field of Classification Search .................. 257/476, 257/483, 486, E29.013
See application file for complete search history.

(56) References Cited

U.S. PATENT DOCUMENTS

| 4,110,775 | A | 8/1978 | Festa |
| 5,241,195 | A | 8/1993 | Tu et al. |
| 5,696,025 | A | 12/1997 | Violette et al. |
| 7,705,415 | B1* | 4/2010 | Nabet ............................. 257/449 |
| 2009/0179297 | A1* | 7/2009 | Stewart et al. ................. 257/475 |

* cited by examiner

*Primary Examiner* — Ngan Ngo
(74) *Attorney, Agent, or Firm* — Baker & McKenzie LLP

(57) ABSTRACT

A Schottky diode comprises an ohmic layer that can serve as a cathode and a metal layer that can serve as an anode, and a drift channel formed of semiconductor material that extends between the ohmic and metal layers. The drift channel includes a heavily doped region adjacent to the ohmic contact layer. The drift channel forms a Schottky barrier with the metal layer. A pinch-off mechanism is provided for pinching off the drift channel while the Schottky diode is reverse-biased. As a result, the level of saturation or leakage current between the metal layer and the ohmic contact layer under a reverse bias condition of the Schottky diode is reduced.

25 Claims, 8 Drawing Sheets

SCHOTTKY DIODE

BACKGROUND

1. Technical Field

The present invention relates to electronic devices, and more particularly, to semiconductor devices suitable for use as a rectifier.

2. Related Art

Schottky diodes had been used for many years in the semiconductor industry as, for example, clamps and rectifiers. Schottky diodes are diodes that include a metal-semiconductor interface that forms a Schottky barrier. The metal-semiconductor interface generally includes a metal layer connected to a doped semiconductor layer. The Schottky barrier is formed at the junction of the metal layer and the doped semiconductor layer.

A substantial difference in barrier heights exists between the forward biased and reversed biased metal-semiconductor interface. When sufficient forward bias is applied, this barrier is essentially removed, thereby allowing electrons to freely flow from the semiconductor material into the metal.

Schottky diodes provide efficient rectification in power applications since their forward voltage drop is less than that of a PN junction diode. Moreover, these devices have fast recovery times making them particularly useful for high frequency rectification.

It is known that Schottky diodes tend to have poor reverse leakage characteristics. Attempts to improve the leakage characteristics have included the addition of a guard ring of the opposite polarity carrier to the Schottky diode structure. However, the fabrication of such a guard ring typically requires an additional masking step. Also, the guard ring takes up space such that Schottky diodes having guard rings require more surface space than Schottky diodes not having such guard rings.

Thus, it is desirable to find alternative approaches for improving the reverse leakage characteristics of Schottky diodes.

SUMMARY

Schottky diodes and methods associated with Schottky diodes are disclosed herein that include embodiments having a reduced reverse leakage compared to prior Schottky diodes. According to some aspects of the present disclosure, a Schottky diode can comprise an ohmic contact layer, a metal layer, and a drift channel that extends between the ohmic contact layer and the metal layer. A pinch-off mechanism is also included for pinching off the drift channel while the Schottky diode is reverse-biased.

The pinch-off mechanism can include a first well and a control gate. The pinch-off mechanism can further include a second well, where the first and second wells can be disposed on opposite sides of the drift channel. The first and second wells can be formed of semiconductor material of a first conductivity type, and the drift channel can be formed of semiconductor material of a second conductivity type. The first conductivity type can be, for example, P-type conductivity, and the second conductivity type can be, for example, N-type conductivity.

The control gate can extend between the first and second wells and across the drift channel. The control gate can include a dielectric layer and a conductor layer. The conductor layer can be formed of polysilicon and the dielectric layer can be formed of silicon dioxide.

The drift channel can be formed within a substrate having a contact face, where the substrate is formed of semiconductor material of the first conductivity type. The substrate can be formed within a well of a second substrate, wherein the second substrate can be formed of semiconductor material of the second conductivity type.

The control gate can be electrically connected to the metal layer.

The drift channel can include a relatively lightly doped portion adjacent to the metal layer and a relatively heavily doped portion adjacent to the ohmic contact.

The Schottky diode can include first and second pinch-off mechanisms. In such embodiments, the first and second pinch-off mechanisms can be configured for pinching off respective branches of the drift channel while the Schottky diode is reverse-biased.

According to some aspects of the present disclosure, a Schottky diode can comprise a Schottky barrier, a drift channel extending from the Schottky barrier, a semiconductor substrate including a first substrate portion, a second substrate portion, and a third substrate portion, and a control gate that extends between the second and third substrate portions. The second and third substrate portions can be configured to selectively exert a pinch-off condition to the drift channel depending at least upon a polarity of voltage applied to the control gate.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

Figure 1:
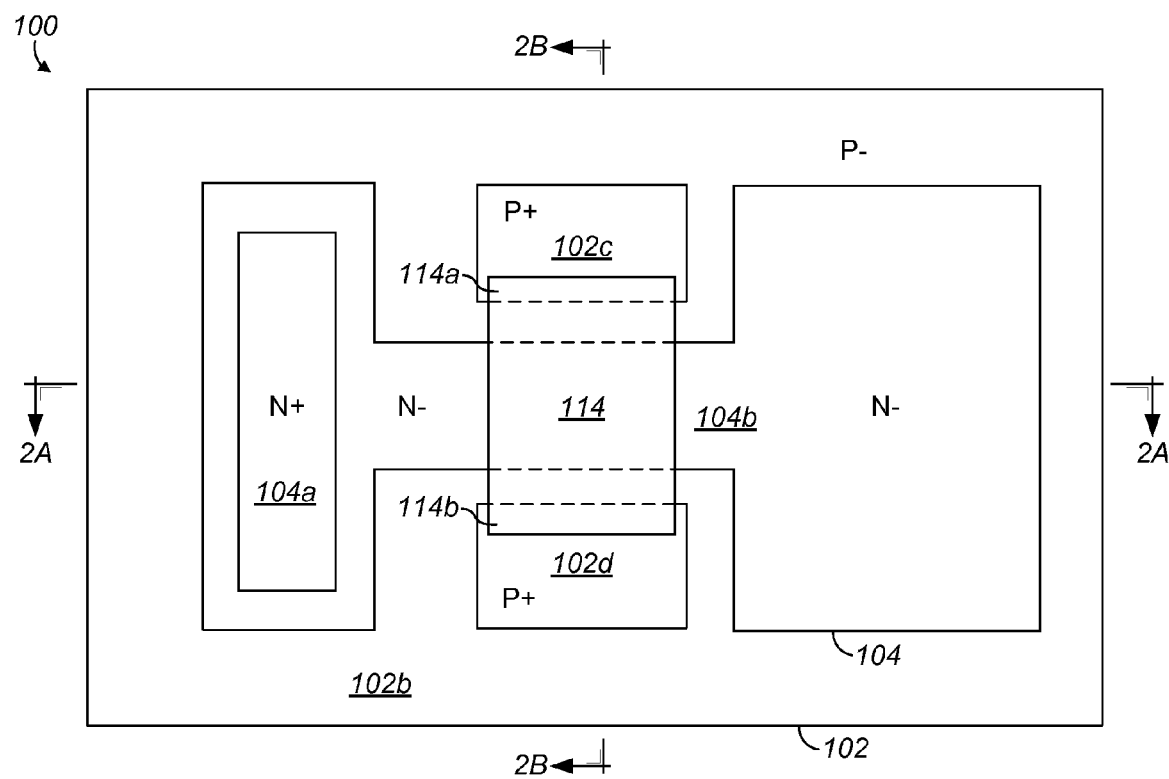
FIG. 1 shows a plan view of a Schottky diode in accordance with an embodiment of the present disclosure.
Figure 2A:
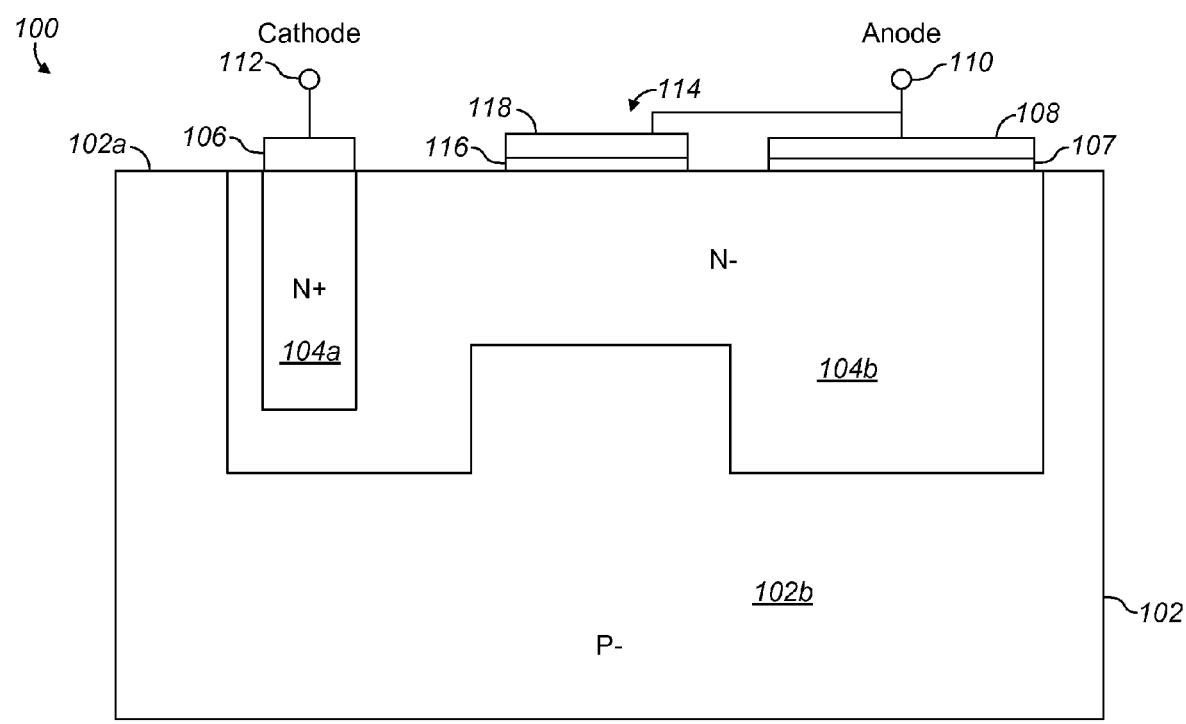
FIG. 2A shows a cross-sectional view of the Schottky diode shown in FIG. 1 taken along section lines 2A-2A.
Figure 2B:
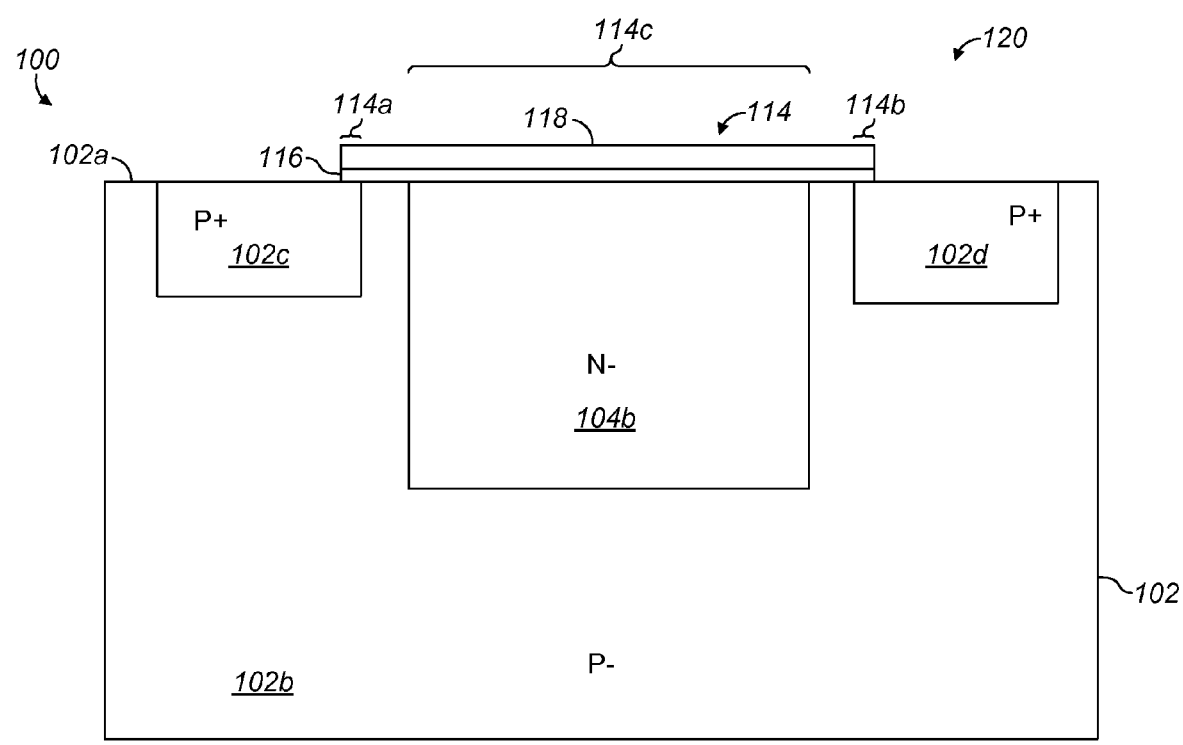
FIG. 2B shows a cross-sectional view of the Schottky diode shown in FIG. 1 taken along section lines 2B-2B.

FIG. 1 shows a plan view of an embodiment of a Schottky diode 100. FIG. 2A shows a cross-sectional view of the Schottky diode 100 taken along section lines 2A-2A, and FIG. 2B shows a cross-sectional view of the Schottky diode 100 taken along section lines 2B-2B. The Schottky diode 100 includes a semiconductor substrate 102, typically silicon, of first conductivity type, typically P-type conductivity, having a contact face 102a. A drift channel 104 of a second conductivity type, typically N-type conductivity, is formed in a first portion 102b of the substrate 102. The first portion 102b of the substrate 102 can be relatively lightly doped, as shown by P−.

As shown in FIG. 2A, the drift channel 104 extends between an ohmic contact layer 106 and a metal layer 108. A first portion 104a of the drift channel 104, adjacent the ohmic contact layer 106, is typically relatively heavily doped, shown by N+. A second portion 104b of the drift channel 104 extends from the first portion 104a to the metal layer 108. The second portion 104b of the drift channel 104 can be relatively lightly doped, as shown by N−.

A Schottky barrier 107 is formed when the semiconductor material of the drift channel 104 is joined with the metal material of the metal layer 108. When the metal and semiconductor material are joined, electrons in the N-type semiconductor material of the drift channel 104 immediately begin to flow into the metal layer 108. This electron flow results in a depletion region in the drift channel 104 near the junction with the metal layer 108. The depletion region is a region where the drift channel 104 becomes somewhat depleted of majority carriers. The electron flow also results in an abundance of carriers in the metal layer 108 near the junction between the metal layer 108 and the drift channel 104. The abundance of carriers in the metal layer 108 creates a negative wall near the junction between the metal layer 108 and the drift channel 104. This "negative wall" forms a surface barrier that is referred to as the "Schottky barrier" 107.

The Schottky diode 100 can also include an anode electrode 110 connected to the metal layer 108 and a cathode electrode 112 connected to the ohmic contact layer 106. The application of a forward bias to the Schottky diode 100 thus can involve application of a more positive voltage potential to the metal layer 108 than a more negative voltage potential at the ohmic contact layer 106. The forward bias will reduce the strength of the Schottky barrier 107 due to the attraction of the applied positive potential for electrons from the Schottky barrier 107 region. The reduction in the strength of the Schottky barrier 107 allows for electron flow from the ohmic contact layer 106, across the drift channel 104, to the metal layer 108.

As shown in FIG. 2B, second and third portions 102c and 102d of the substrate 102, also referred to as first and second well portions 102c and 102d, are formed on opposing sides of the drift channel 104. The first and second well portions 102c and 102d can be relatively heavily doped, as shown by P+. A control gate 114 extends between the first and second well portions 102c and 102d. A first portion 114a of the control gate 114 can overlap the first well portion 102c, and a second portion 114b of the control gate 114 can overlap the second well portion 102d. Also, a third portion 114c extends across the second portion 104b of the drift channel 104.

The control gate 114 can include a dielectric layer 116 and a conductor layer 118. The dielectric layer 116 can be formed of an oxide material, for example silicon dioxide ($SiO_2$). The dielectric layer 116 can adjoin at least a portion of the first well portion 102c, at least a portion of the second well portion 102d, and at least a portion of the second portion 104b of the drift channel 104. The conductor layer 118 can adjoin the dielectric layer 116 and can formed of a conductive material, for example polysilicon.

As shown in FIG. 2A, the control gate 114 is electrically connected to the metal layer 108.

Figure 2C:
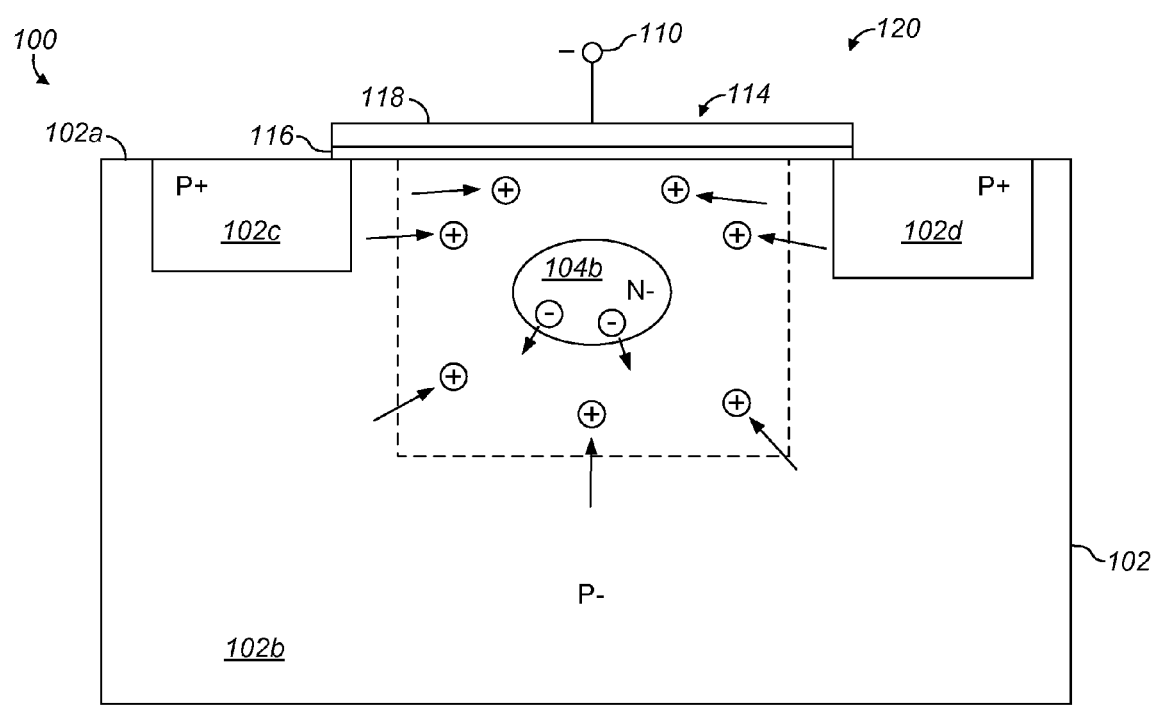
FIG. 2C shows a cross-sectional view of the Schottky diode shown in FIG. 1 taken along section lines 2B-2B while the Schottky diode is reverse-biased.

FIG. 2C shows a cross-sectional view of the Schottky diode 100 taken along section lines 2B-2B while a negative potential is applied to the control gate 114. When the Schottky diode 100 is reverse-biased, the control gate 114 obtains the negative potential that is applied to the anode electrode 110 and the metal layer 108. As shown in FIG. 2C, the negative potential at the control gate 114 will tend to pressure electrons of the N-type drift channel 104 toward the P-type substrate 102, and attract holes from the P-type substrate 102, including majority carriers from the well portions 102c and 102d. Depending on the magnitude of the negative bias at the control gate 114, a level of recombination between electrons and holes will occur that will reduce the number of free electrons in the N-type drift channel 104 available for conduction. The more negative the bias, the higher the rate of recombination. The resulting level of saturation or leakage current between the metal layer 108 and the ohmic contact layer 106 under a reverse bias condition of the Schottky diode 100 is therefore reduced with decreasing bias at the control gate 104. Thus, the negative bias at the control gate 114 causes depletion of the drift channel 104 below the control gate 114, thereby causing pinch-off of the drift channel 104. Accordingly, a pinch-off mechanism 120 is formed by the control gate 114 and the well portions 102c and 102d for pinching off the drift channel 104 when the Schottky diode 100 is reverse-biased.

When the Schottky diode 100 is forward-biased, the control gate 114 obtains the positive potential that is applied to the anode electrode 110 and the metal layer 108. The positive potential at the control gate 114 will draw additional electrons (free carriers) from the P-type substrate 102 and establish new carriers through the collisions resulting between accelerating particles. As the voltage potential at the control gate 114 continues to increase, the number of free electrons in the N-type drift channel 104 available for conduction also increases. This increase in free electrons in the drift channel 104 can enhance the electron flow through the Schottky diode 100 while the Schottky diode 100 is forward-biased. Accordingly, the pinch-off mechanism 120 removes the pinching off of the drift channel 104 when the Schottky diode 100 is forward-biased.

In some embodiments, various isolation structures can be used in order to isolate the presently disclosed Schottky diode from adjacent electronic devices. For example, in some embodiments, shallow isolation structures can be created using known Local Isolation of Silicon (LOCOS) techniques. Another example is shown in FIGS. 3 and 4A-4B.

Figure 3:
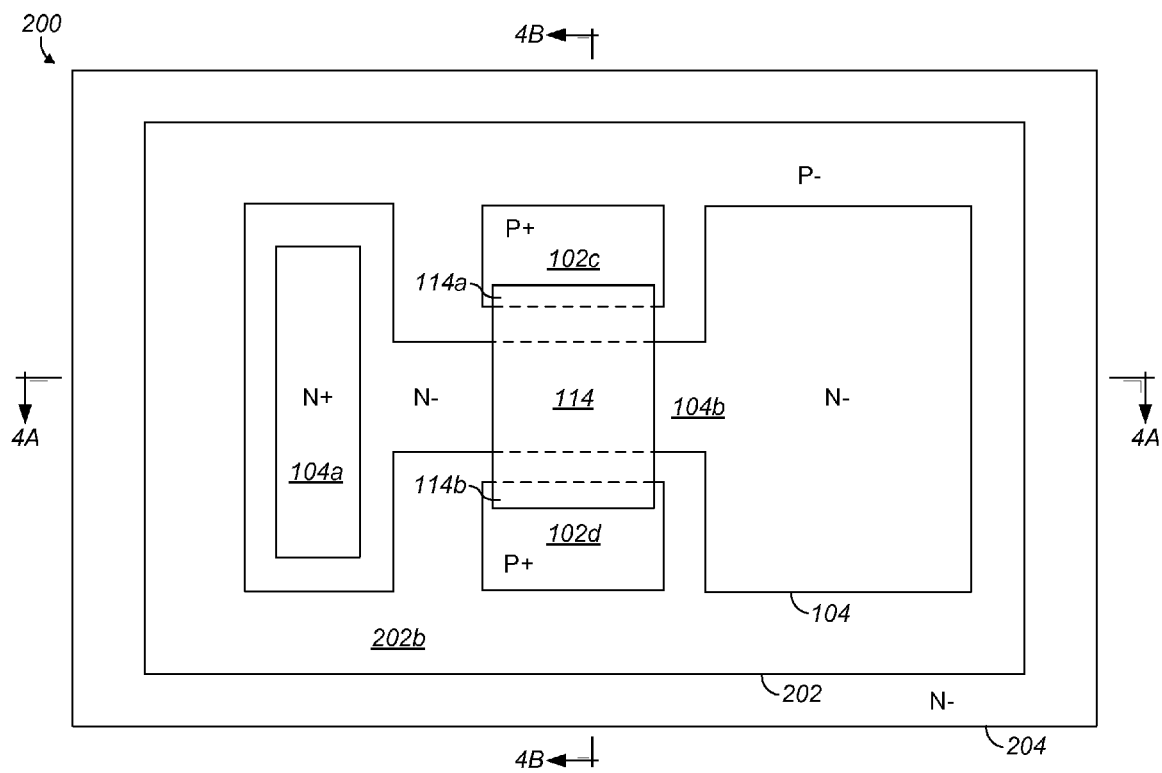
FIG. 3 shows a plan view of a Schottky diode in accordance with an alternative embodiment of the present disclosure.
Figure 4A:
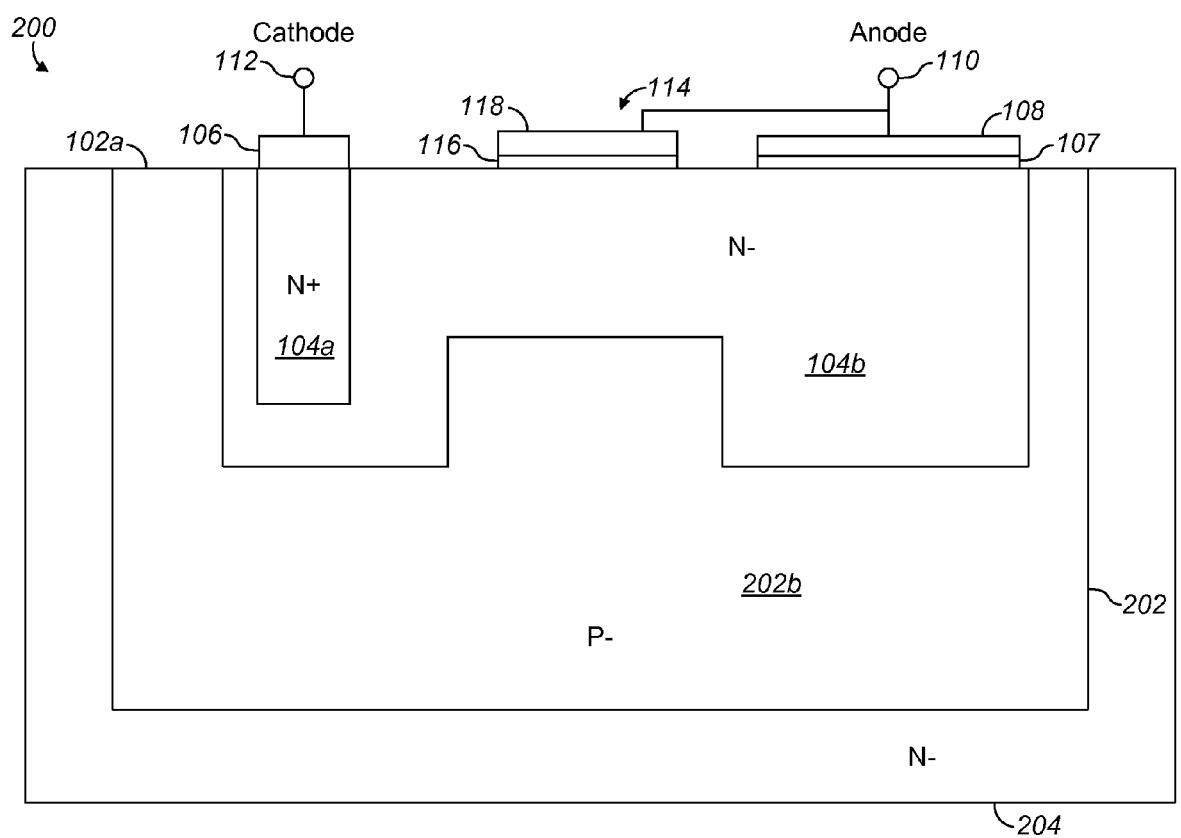
FIG. 4A shows a cross-sectional view of the Schottky diode shown in FIG. 3 taken along section lines 4A-4A.
Figure 4B:
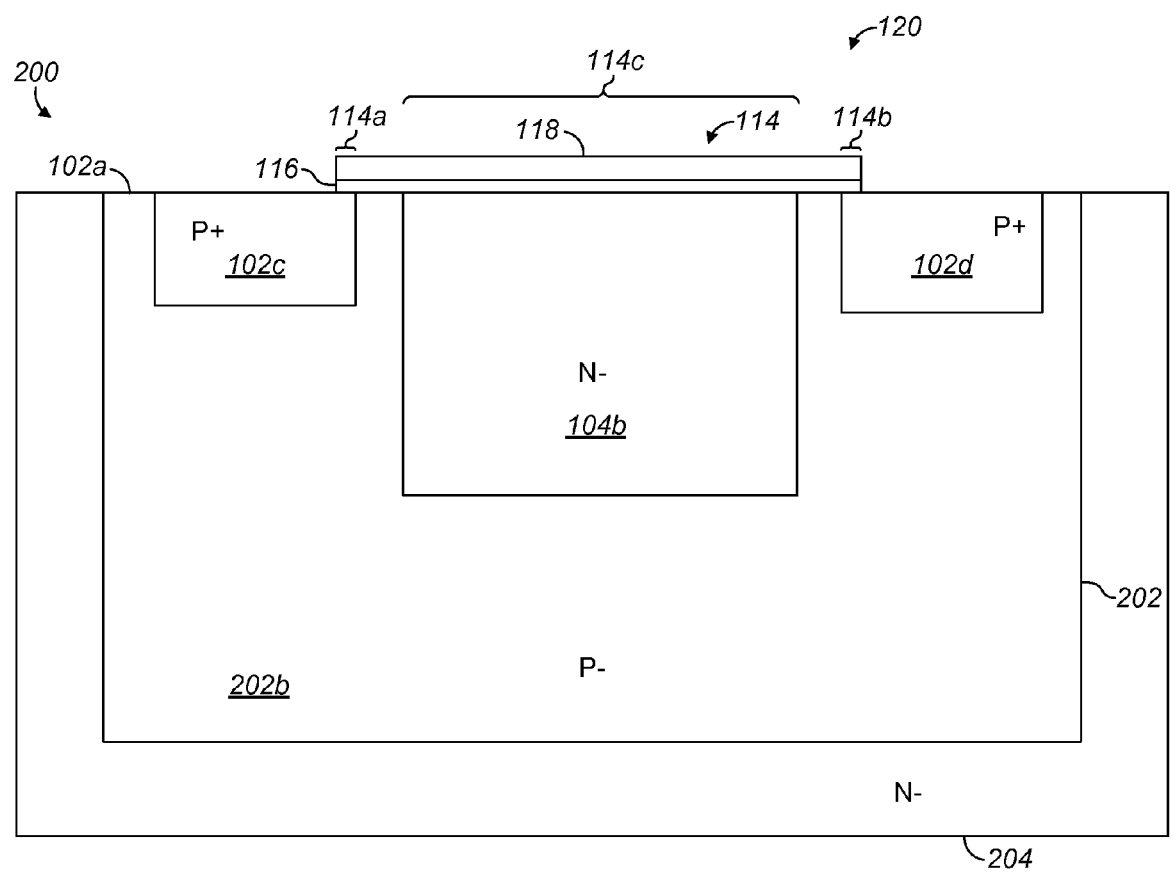
FIG. 4B shows a cross-sectional view of the Schottky diode shown in FIG. 3 taken along section lines 4B-4B.

FIG. 3 shows a plan view of a second embodiment of a Schottky diode 200. Elements of the Schottky diode 200 that are similar to or the same as those of the Schottky diode 100 are denoted by the same reference numerals, and description thereof is not repeated. FIG. 4A shows a cross-sectional view of the Schottky diode 200 taken along section lines 4A-4A, and FIG. 4B shows a cross-sectional view of the Schottky diode 200 taken along section lines 4B-4B.

The Schottky diode 200 includes a substrate 202, which can also be referred to as well 202. The substrate 202 is composed of semiconductor material of a first conductivity type, typically P-type conductivity. The substrate 202 is formed within a well of a semiconductor substrate 204, typically silicon, of second conductivity type, typically N-type conductivity. The semiconductor substrate 204 has a contact face 102a. The drift channel 104 is also of the second conductivity type, typically N-type conductivity, and is formed in a first portion 202b of the substrate/well 202. The semiconductor substrate 204 can be relatively lightly doped, as shown by N−. The first portion 202b of the substrate/well 202 can also be relatively lightly doped, as shown by P−.

The operation of the Schottky diode 200, including the ability of the pinch-off mechanism 120 to pinch-off the drift channel 104 during reverse-biasing of the Schottky diode 200 and to release the pinch-off of the drift channel 104 during forward-biasing of the Schottky diode 200, is the same as described above in connection with the Schottky diode 100. The primary difference between the Schottky diode 200 and the Schottky diode 100 is that the Schottky diode 200 includes the additional N-type material (substrate 204) around at least a portion of the periphery of the first portion 202b of the P-type substrate/well 200.

The N-type material of the substrate 204 provides for improved electrical isolation of the Schottky diode 200 from adjacent electrical devices. When the N-type material of the substrate 204 is brought into contact with the P-type material of the substrate 202, the electrons and holes begin to combine in regions adjacent to the junction between the N-type substrate 204 material and the P-type substrate 202 material. This recombination process results in a lack of carriers in the regions adjacent to the junction. In other words, a depletion region is created in the regions adjacent to the junction between the N-type substrate 204 material and the P-type substrate 202 material due to the depletion of carriers in these regions. The depletion region includes a barrier of positive ions that the majority carriers in the P-type material of the substrate 202 must overcome in order to migrate into the N-type material of the substrate 204. For this reason, relatively few of the majority carriers of the P-type material of the substrate 202 will migrate to the substrate 204 as leakage current. For similar reasons, relatively few of the majority carriers of the N-type material of the substrate 204 will migrate to the substrate 202 as leakage current. Accordingly, the isolation structure of the Schottky diode 200 can result in a reduction in leakage current to and from the Schottky diode 200.

Figure 5:
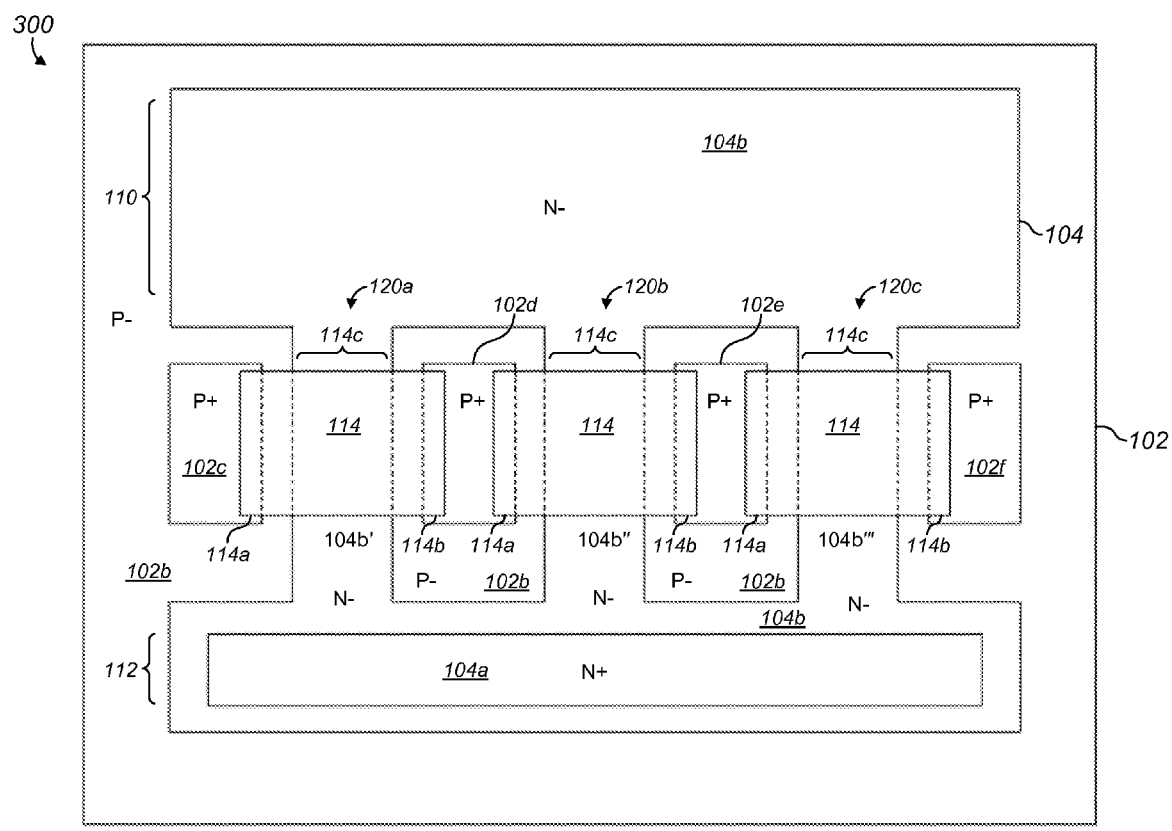
FIG. 5 shows a plan view of a Schottky diode in accordance with another alternative embodiment of the present disclosure.

FIG. 5 shows a plan view of a third embodiment of a Schottky diode 300. Elements of the Schottky diode 300 that are similar to or the same as those of the Schottky diode 100 are denoted by the same reference numerals, and description thereof is not repeated.

The construction and operation of the Schottky diode 300 is the same as described above in connection with the Schottky diode 100, except that the Schottky diode 300 includes a plurality pinch-off mechanisms 120a-120c. Thus, while not shown in FIG. 5, the Schottky diode 300 can include an anode 110 and cathode 112 that are the same as those shown and described for Schottky diode 100, including an ohmic contact layer 106 disposed over the first portion 104a of the drift channel 104, and a Schottky barrier 107 and metal layer 108 disposed over the second portion 104b of the drift channel 104.

In the embodiment shown in FIG. 5, the second portion 104b of the drift channel 104 includes three branches 104b', 104b'', and 104b''' that extend between the anode 110 and cathode 112 regions. Each of the pinch-off mechanisms 120a-120c includes a respective control gate 114 electrically connected to the anode of the Schottky diode 300. The pinch-off mechanism 120a includes a control gate 114 that includes first control gate portion 114a that overlaps a first well portion 102c, a second control gate portion 114b that overlaps a second well portion 102d, and a third control gate portion 114c that extends across the first branch 104b' of the drift channel 104. The pinch-off mechanism 120b includes a control gate 114 that includes first control gate portion 114a that overlaps the second well portion 102d, a second control gate portion 114b that overlaps a third well portion 102e, and a third control gate portion 114c that extends across the second branch 104b'' of the drift channel 104. The pinch-off mechanism 120c includes a control gate 114 that includes first control gate portion 114a that overlaps the third well portion 102e, a second control gate portion 114b that overlaps a fourth well portion 102f, and a third control gate portion 114c that extends across the third branch 104b''' of the drift channel 104.

The ability of the pinch-off mechanisms 120a-120c to pinch-off respective branches 104b', 104b'', and 104b''' of the drift channel 104 during reverse-biasing of the Schottky diode 300, and to release the pinch-off of respective branches 104b', 104b'', and 104b''' of the drift channel 104 during forward-biasing of the Schottky diode 300, is the same as described above for pinch-off mechanism 120. However, this multi-branch configuration is well-suited for higher-current applications.

While three pinch-off mechanisms 120a-120c and respective branches 104b', 104b'', and 104b''' are shown, alternative embodiments can include any number of pinch-off mechanisms 120a-120c and respective branches 104b', 104b'', and 104b'''. Also, an alternative embodiment can include multiple pinch-off mechanisms 120a-120c and respective branches 104b', 104b'', and 104b''' along with an isolation structure, such as disclosed in connection with the Schottky diode 200.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A Schottky diode comprising:
   an ohmic contact layer;
   a metal layer;
   a drift channel that extends between the ohmic contact layer and the metal layer; and
   a pinch-off mechanism for pinching off the drift channel while the Schottky diode is reverse-biased.

2. The Schottky diode of claim 1, wherein the pinch-off mechanism includes a first well and a control gate.

3. The Schottky diode of claim 2, wherein the pinch-off mechanism further includes a second well, and wherein the first and second wells are disposed on opposite sides of the drift channel.

4. The Schottky diode of claim 3, wherein the first and second wells are formed of semiconductor material of a first conductivity type, and wherein the drift channel is formed of semiconductor material of a second conductivity type.

5. The Schottky diode of claim 4, wherein the first conductivity type is P-type conductivity, and wherein the second conductivity type is N-type conductivity.

6. The Schottky diode of claim 4, wherein the control gate extends between the first and second wells and across the drift channel.

7. The Schottky diode of claim 6, wherein the control gate comprises dielectric layer and a conductor layer.

8. The Schottky diode of claim 7, wherein the conductor layer is formed of polysilicon and the dielectric layer is formed of silicon dioxide.

9. The Schottky diode of claim 6, wherein the drift channel is formed within a substrate having a contact face, wherein the substrate is formed of semiconductor material of the first conductivity type.

10. The Schottky diode of claim 9, wherein the substrate is formed within a well of a second substrate, wherein the second substrate is formed of semiconductor material of the second conductivity type.

11. The Schottky diode of claim 2, wherein the control gate is electrically connected to the metal layer.

12. The Schottky diode of claim 1, wherein the drift channel includes a relatively lightly doped portion adjacent to the metal layer and a relatively heavily doped portion adjacent to the ohmic contact.

13. The Schottky diode of claim 1, wherein said pinch-off mechanism is a first pinch-off mechanism, wherein the Schottky diode further comprises a second pinch-off mechanism, wherein the first and second pinch-off mechanisms are for pinching off respective branches of the drift channel while the Schottky diode is reverse-biased.

14. A Schottky diode comprising:
a Schottky barrier;
a drift channel extending from the Schottky barrier;
a semiconductor substrate including a first substrate portion, a second substrate portion, and a third substrate portion; and
a control gate that extends between the second and third substrate portions;
wherein the second and third substrate portions are configured to selectively exert a pinch-off condition to the drift channel depending at least upon a polarity of voltage applied to the control gate.

15. The Schottky diode of claim 14, wherein the semiconductor substrate is formed of semiconductor material of a first conductivity type.

16. The Schottky diode of claim 15, wherein the first substrate portion is relatively lightly doped, and wherein the second and third substrate portions are relatively heavily doped.

17. The Schottky diode of claim 16, wherein the drift channel extends between the second and third substrate portions.

18. The Schottky diode of claim 17, wherein the drift channel is formed of semiconductor material of a second conductivity type.

19. The Schottky diode of claim 18, wherein the first conductivity type is P-type conductivity, and wherein the second conductivity type is N-type conductivity.

20. The Schottky diode of claim 15, wherein the substrate is formed within a well of a second substrate, wherein the second substrate is formed of semiconductor material of a second conductivity type.

21. The Schottky diode of claim 14, wherein the control gate comprises dielectric layer and a conductor layer.

22. The Schottky diode of claim 21, wherein the conductor layer is formed of polysilicon and the dielectric layer is formed of silicon dioxide.

23. The Schottky diode of claim 14, wherein the control gate is electrically connected to the Schottky barrier.

24. The Schottky diode of claim 14, further comprising an ohmic contact layer, wherein the drift channel includes a relatively lightly doped portion adjacent to the Schottky barrier and a relatively heavily doped portion adjacent to the ohmic contact layer.

25. The Schottky diode of claim 14, wherein the control gate is a first control gate, wherein the Schottky diode further comprises a second control gate that extends between the third substrate portion and a fourth substrate portion, wherein the second and third substrate portions are configured to selectively exert a pinch-off condition to a first branch of the drift channel depending at least upon a polarity of voltage applied to the control gate, and wherein the third and fourth substrate portions are configured to selectively exert a pinch-off condition to a second branch of the drift channel depending at least upon a polarity of voltage applied to the control gate.

* * * * *